SEMICONDUCTOR AMPLIFIER AND ELECTRODE STRUCTURE THEREFOR
Original Filed June 17, 1948 3 Sheets-Sheet 1
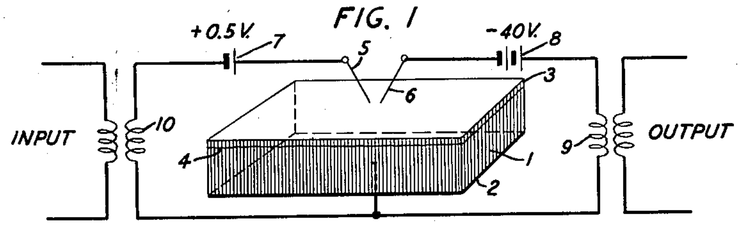
FIG. 1A
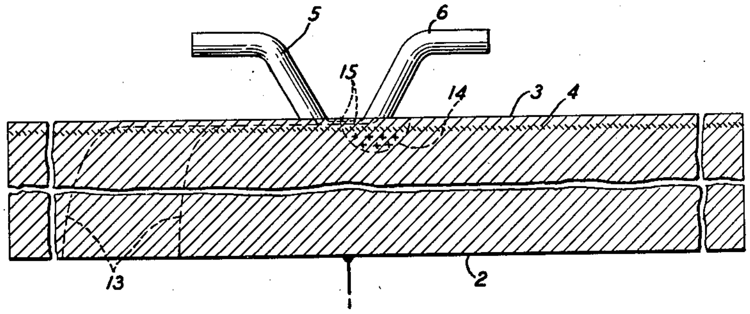
FIG. 2
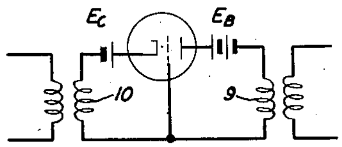
FIG. 10
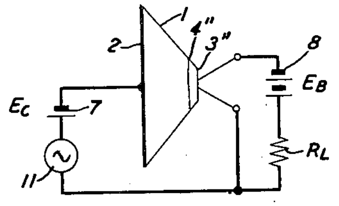
FIG. 11
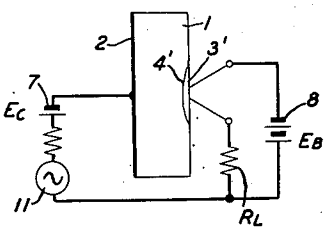
FIG. 12
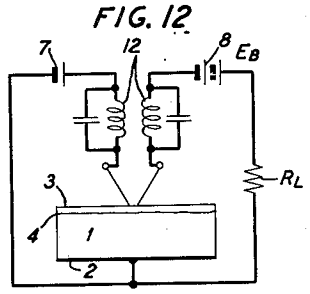
INVENTORS: J. BARDEEN
W. H. BRATTAIN
BY Harry C. Hart
ATTORNEY

SEMICONDUCTOR AMPLIFIER AND ELECTRODE STRUCTURE THEREFOR

Original Filed June 17, 1948 3 Sheets-Sheet 2

INVENTORS: J. BARDEEN
W. H. BRATTAIN
BY Harry C. Hart
ATTORNEY

SEMICONDUCTOR AMPLIFIER AND ELECTRODE STRUCTURE THEREFOR

Original Filed June 17, 1948 3 Sheets–Sheet 3

INVENTORS: J. BARDEEN
W. H. BRATTAIN
BY Harry C. Hart
ATTORNEY

Patented Mar. 18, 1952

2,589,658

UNITED STATES PATENT OFFICE 2,589,658

SEMICONDUCTOR AMPLIFIER AND ELECTRODE STRUCTURES THEREFOR

John Bardeen, Summit, and Walter H. Brattain, Morristown, N. J., assignors to Bell Telephone Laboratories, Incorporated, New York, N. Y., a corporation of New York Original application June 17, 1948, Serial No. 33,466, now Patent No. 2,524,035, dated October 3, 1950. Divided and this application September 15, 1949, Serial No. 115,837

11 Claims. (Cl. 175—366)

This application is a division of application Serial No. 33,466, filed June 17, 1948, issued October 3, 1950, as Patent 2,524,035.

This invention relates to a novel method of and means for translating electrical variations for such purposes as amplification, wave generation, and the like.

The principal object of the invention is to amplify or otherwise translate electric signals or variations by use of compact, simple, and rugged apparatus of novel type.

Another object is to provide a circuit element for use as an amplifier or the like which does not require a heated thermionic cathode for its operation, and which therefore is immediately operative when turned on. A related object is to provide such a circuit element which requires no evacuated or gas-filled envelope.

Attempts have been made in the past to convert solid rectifiers utilizing selenium, copper sulfide, or other semiconductive materials into amplifiers by the direct expedient of embedding a grid-like electrode in a dielectric layer disposed between the cathode and the anode of the rectifier. The grid is supposed, by exerting an electric force at the surface of the cathode, to modify its emission and so alter the cathode-anode current. As a practical matter it is impossible to embed a grid in a layer which is so thick as to insulate the grid from the other electrodes and yet so thin as to permit current to flow between them. It has also been proposed to pass a current from end to end of a strip of homogeneous isotropic semiconductive material and, by the application of a strong transverse electrostatic field, to control the resistance of the strip, and hence the current through it.

So far as it known, all of such past devices are beyond human skill to fabricate with the fineness necessary to produce amplification. In any event they do not appear to have been commercially successful.

It is well known that in semiconductors there are two types of carriers of electricity which differ in the signs of the effective mobile charges. The negative carriers are excess electrons which are free to move, and are denoted by the term conduction electrons or simply electrons. The positive carriers are missing or defect "electrons," and are denoted by the term "holes." The conductivity of a semiconductor is called excess or defect, or N or P type, depending on whether the mobile charges normally present in excess in the material under equilibrium conditions are electrons (negative carriers) or holes (positive carriers).

When a metal electrode is placed in contact with a semiconductor and a potential difference is applied across the junction, the magnitude of the current which flows often depends on the sign as well as on the magnitude of the potential. A junction of this sort is called a rectifying contact. If the contact is made to an N-type semiconductor, the direction of easy current flow is that in which the semiconductor is negative with respect to the electrode. With a P-type semiconductor, the direction of easy flow is that in which the semiconductor is positive. A similar rectifying contact exists at the boundary between two semiconductors of opposite conductivity types.

This boundary may separate two semiconductor materials of different constitutions, or it may merely separate zones or regions, within a body of semiconductor material which is chemically and stoichiometrically uniform, which exhibit different conductivity characteristics.

The present invention in one form utilizes a block of semiconductor material on which three electrodes are placed. One of these, termed the collector, makes rectifier contact with the body of the block. The other, termed the emitter, preferably makes rectifier contact with the body of the block also. The third electrode, which may be designated the base electrode, preferably makes a low resistance contact with the body of the block. When operated as an amplifier, the emitter is normally biased in the direction of easy current flow with respect to the body of the semiconductor block. The nature of the emitter electrode and of that portion of the semiconductor which is in the immediate neighborhood of the electrode contact is such that a substantial fraction of the current from this electrode is carried by charges whose signs are opposite to the signs of the mobile charges normally in excess in the body of the semiconductor. The collector is biased in the reverse, or high resistance direction rlative to the body of the semiconductor. In the absence of the emitter, the current to the collector flows exclusively from the base electrode and is impeded by the high resistance of this collector contact. The sign of the collector bias potential is such as to attract the carriers of opposite sign which come from the emitter. The collector is so disposed in relation to the emitter that a large fraction of the emitter current enters the collector. The fraction depends in part on the geometrical disposition of the electrodes and in part on the bias potentials applied. As the emitter is biased in the direction of easy flow, the emitter current is sensitive to small changes in potential between the emitter and the body of semiconductor, or between the emitter and the base electrode. Application of a small voltage variation between the base electrode and emitter causes a relatively large change in the current entering the semiconductor from the emitter, and a correspondingly large change in the current to the collector. One effect of the change in emitter current is to modify the total current flowing to the collector, so that the over-all change in collector current may be greater than the change in the emitter current. The collector circuit may contain a load of high impedance matched to the internal impedance of the collector, which, because of the high resistance rectifier contact of the collector, is high. As a result, voltage amplification, current amplification, and power amplification of the input signal are obtained.

In one form, the device utilizes a block of semiconductor material of which the main body is of one conductivity type while a very thin surface layer or film is of opposite conductivity type. The surface layer is separated from the body by a high resistance rectifying barrier. The emitter and collector electrodes make contact with this surface layer sufficiently close together for mutual influence in the manner described above. The base electrode makes a low resistance contact with the body of the semiconductor. When suitable bias potentials are applied to the various electrodes, a current flows from the emitter into the thin layer. Owing to the conductivity of the layer and to the nature of the barrier, this current tends to flow laterally in the thin layer, rather than following the most direct path across the barrier to the base electrode. This current is composed of carriers whose signs are opposite to the signs of the mobile charges normally in excess in the body of the semiconductor. In other words, when there is a thin layer of opposite conductivity type immediately under the emitter electrode, the current flowing into the block in the direction of easy flow consists largely of carriers of opposite sign to those of the mobile charges normally present in excess in the body of the block; and the presence of these carriers increases the conductivity of the block. The bias voltage on the collector which, as stated above, is biased in the reverse or high resistance direction relative to the block, produces a strong electrostatic field in a region surrounding the collector so that the current from the emitter which enters this region is drawn in to the collector. Thus, the collector current, and hence the conductance of the unit as a whole, are increased. The size of the region in which this strong field exists is comparatively insensitive to variations in the collector potential so that the impedance of the collector circuit is high. On the other hand, the current from the emitter to the layer is extremely sensitive to variations of the emitter potential, so that the impedance of the emitter circuit is low.

It is a feature of the invention that the input and output impedances of the device are controlled by choice and treatment of the semiconductor material body and of its surface, as well as by choice of the bias potentials of the electrodes.

From the standpoint of its external behavior and uses, the device of the invention resembles a vacuum tube triode; and while the electrodes are designated emitter, collector and base electrode, respectively, they may be externally interconnected in the various ways which have become recognized as appropriate for triodes, such as the conventional, the "grounded grid," the "grounded plate" or cathode followed, and the like. Indeed, the discovery on which the invention is based was first made with circuit connections which are extremely similar to the so-called "grounded grid" vacuum tube connections. However, the analogies among the circuits are, of course, no better than the analogy between emitter and cathode, base electrode and grid, collector and anode.

By feeding back a portion of the output voltage in proper phase to the input terminals, the device may be caused to oscillate at a frequency determined by its external circuit elements, and, among other tests, power amplification was confirmed by a feedback connection which caused it to oscillate.

It has been found that the performance of the device is expressed, to a good approximation, by the following functional relations:

$$I_e = f(V_e + R_F I_c) \qquad (1)$$

$$I_c = I_c^0(V_c) + a I_e \qquad (1a)$$

where $I_e$=emitter current $I_c$=collector current $I_c^0$ $(V_c)$=collector current with emitter disconnected $V_e$=voltage of emitter electrode measured with respect to the base electrode $V_c$=voltage of collector electrode measured with respect to the base electrode $R_F$=an equivalent resistance independent of bias $a$=a numerical factor which depends on the bias voltages $f(V_e)$ gives the relation between emitter current and emitter voltage with the collector circuit open.

The interpretation of the foregoing equation 1 is that the collector current lowers the potential of the surface of the block in the vicinity of the emitter relative to the base electrode by an amount $R_F I_c$, and thus increases the effective bias voltage on the emitter by the same amount. The term $R_F I_c$ thus represents positive feedback.

The invention will be fully apprehended from the following detailed description of one embodiment thereof, taken in connection with the appended drawings, in which:

Fig. 1 is a schematic diagram, partly in perspective, showing a preferred embodiment of the invention;

Fig. 1*a* is a cross-section of a part of Fig. 1 to a greatly enlarged scale;

Fig. 2 is the equivalent vacuum tube schematic circuit of Fig. 1;

Figure 3:
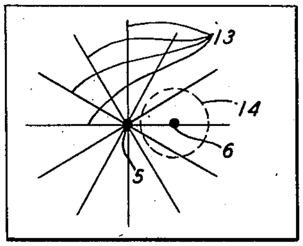
Fig. 3 is a plan view of the block of Fig. 1, showing the disposition of the electrodes.
Figure 3A:
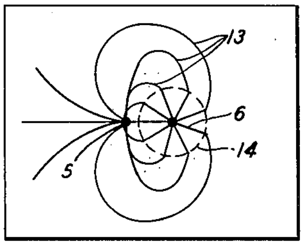
Figure 4:
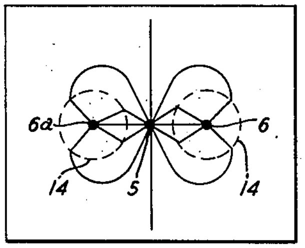
Figure 5:
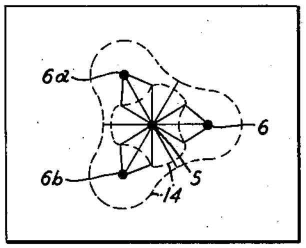
Figure 6:
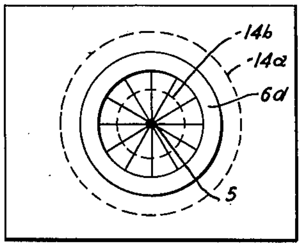
Figure 8:
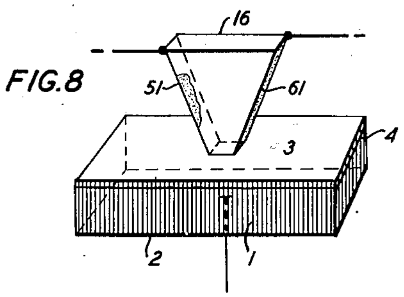
Figure 9:
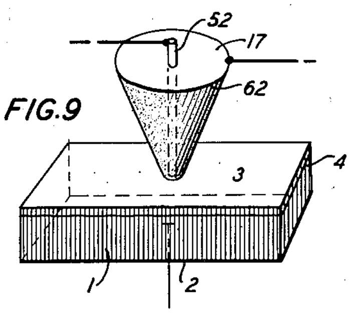
Figure 13:
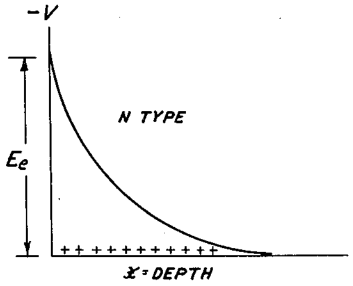
Figures 14, 15, 16:
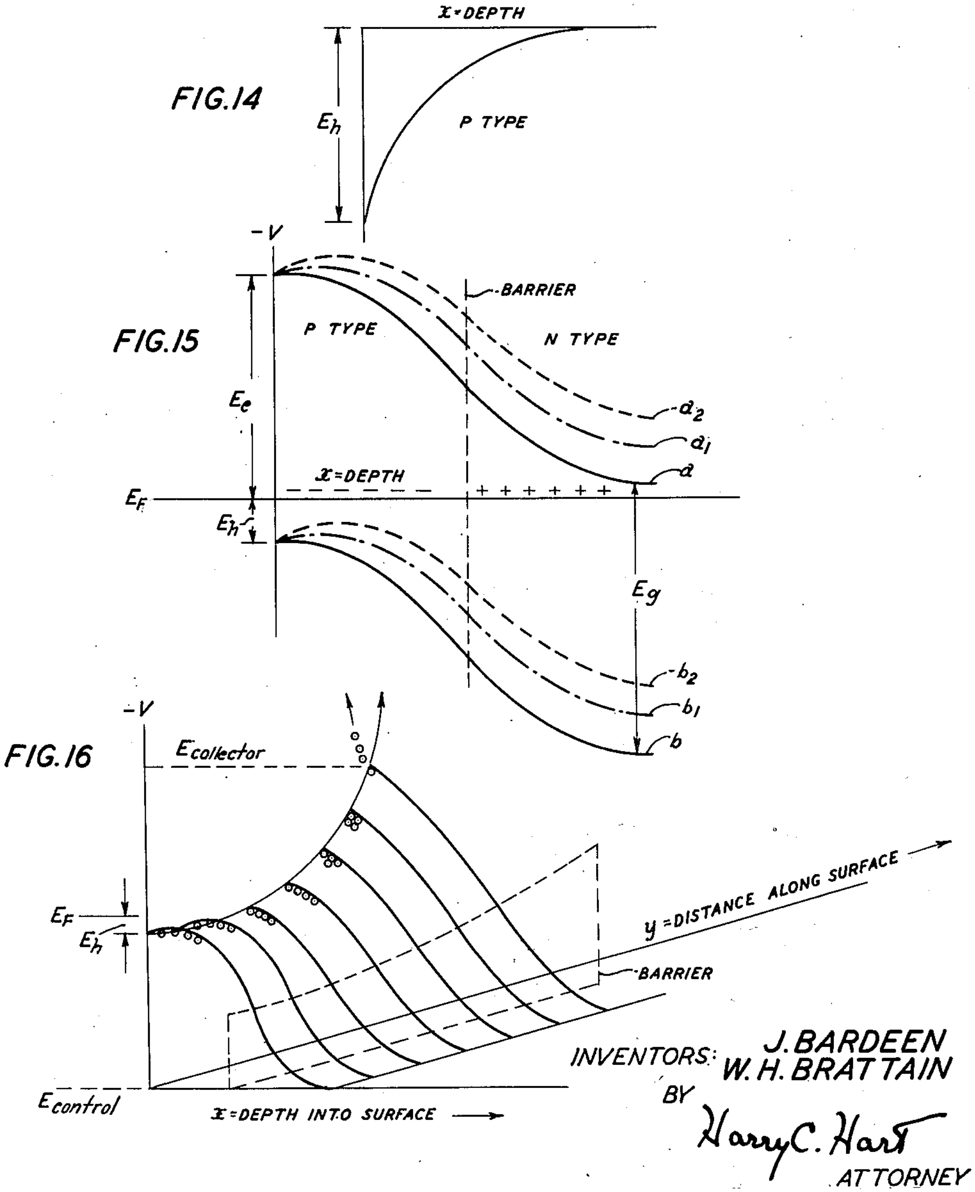

Fig. 3*a* is like Fig. 3 but shows the influence of the collector in modifying the emitter current;

Figs. 4, 5, 6 and 7 show electrode dispositions alternative to those of Fig. 1;

Figs. 8 and 9 show electrode structures alternative to those of Fig. 1;

Fig. 10 shows a modified unit of the invention connected for operation in the circuit of a conventional triode;

Fig. 11 shows another modified unit of the invention connected for operation in a "grounded plate" or cathode follower circuit;

Fig. 12 shows the unit of the invention connected for self-sustained oscillation;

Fig. 13 is a diagram showing the electron potential distribution in the interior of an N-type semiconductor in contact with a metal;

Fig. 14 is a diagram showing the electron potential distribution in the interior of a P-type semiconductor in contact with a metal;

Fig. 15 is a diagram showing the electron potential distribution in the interior of a thin P-type semiconductive layer in contact on one side with a metal and on the other side with a body of N-type semiconducting material, for electrons in the conduction band (upper curves) and in the filled band (lower curves); and Fig. 16 is a diagram showing the variation of the potential distribution of curve *b* of Fig. 15 as a function of distance from the emitter to the collector.

The materials with which the invention deals are those semiconductors whose electrical characteristics are largely dependent on the inclusion therein of very small amounts of significant impurities. The expression "significant impurities" is here used to denote those impurities which affect the electrical characteristics of the material such as its resistivity, photosensitivity, rectification, and the like, as distinguished from other impurities which have no apparent effect on these characteristics. The term "impurities" is intended to include intentionally added constituents as well as any which may be included in the basic material as found in nature or as commercially available. Germanium is such a material which, along with some representative impurities, will furnish an illustrative example for explanation of the present invention. Silicon is another such material. In the case of semiconductors which are chemical compounds such as cuprous oxide ($Cu_2O$) or silicon carbide (SiC), deviations from stoichiometric composition may constitute significant impurities.

Small amounts, i. e., up to 0.1 per cent of impurities, generally of higher valency than the basic semiconductor material, e. g., phosphorous in silicon, antimony and arsenic in germanium, are termed "donor" impurities because they contribute to the conductivity of the basic material by donating electrons to an unfilled "conduction energy band" in the basic material. In such case the donated negative electrons constitute the carriers of current and the material and its conductivity are said to be of the N-type. Similar small amounts of impurities, generally of lower valency than the basic material, e. g., boron in silicon or aluminum in germanium, are termed "acceptor" impurities because they contribute to the conductivity by "accepting" electrons from the atoms of the basic material in the filled band. Such an acceptance leaves a gap or "hole" in the filled band. By interchange of the borrowed electrons from atom to atom, these positive "holes" effectively move about and constitute the carriers of current, and the material and its conductivity are said to be of the P-type.

Under equilibrium conditions, the conductivity of an electrically neutral region or zone of such a semiconductor material is directly related to the concentration of significant impurities. Donor impurities which have given up electrons to an unfilled band are positively charged, and may be thought of as fixed positive ions. In a region of a semiconductor which has only donor type impurities, the concentration of conduction electrons is equal to the concentration of ionized donors. Similarly, in a region of a semiconductor which has only acceptor impurities, the concentration of holes is equal to the concentration of the negatively charged acceptor ions.

If for any reason there is a departure from electrical neutrality in a region, giving a resultant space charge, the magnitude of the conductivity, and even the conductivity type may differ from that indicated by the significant impurities. It was once thought that the high resistance barrier layer in a rectifier differs somehow in chemical constitution or in the nature of the significant impurities from the main body of the semiconductor. W. Schottky, in Zeits., f. Phys., volume 113, page 367 (1939), has shown that this is not necessary. While the concentration of carriers (mobile charges) in the barrier layer is small, the concentration of ionized impurities (fixed charges) may be the same as in the body of the semiconductor. The fixed charges in the barrier layer act in concert with induced charges of opposite sign on the metal electrode to produce a potential drop between the electrode and the body of the semiconductor. The concentration of carriers at a point depends on the electrostatic potential at that point, and is small compared with the equilibrium concentration in the body of the semiconductor if the potential differs from that in the body by more than a small fraction of a volt. The mathematical theory has been developed by W. Schottky and E. Spenke in Wiss. Veroff. Siemens Werke, vol. 18, page 225 (1939). These authors show that if the variation in electrostatic potential with depth below the surface is sufficiently large, the conductivity passes through a minimum for a certain potential and depth and the conductivity is of opposite type for larger values of the potential corresponding to smaller values of depth. They call the region of opposite conductivity type an inversion region. It is thus possible to have at a rectifier contact a thin layer of one conductivity type next to the metal electrode, separated by a high resistance barrier from the body of opposite conductivity type.

It has been pointed out by J. Bardeen in Phys. Rev., vol. 71, page 717 (1947) that the same sort of barrier layer that Schottky found for rectifying contacts may exist beneath the free surface of a semiconductor, the space charge of the barrier layer being balanced by a charge of opposite sign on the surface atoms. It is possible, for example, to have a thin layer of P-type conductivity at the free surface of a block which has a uniform concentration of donor impurities and which, therefore, has N-type conductivity in the body of the block, even though there are no actual acceptor impurities.

To distinguish such a situation from the similar one which depends on the presence of significant chemical impurities of opposite type in a thin surface layer, the terms "physical" and "chemical" are employed. Thus the terms "physical layer" and "physical barrier" refer to the layer of opposite conductivity type next to the surface and the high resistance barrier which separates it from the body of the semiconductor, both of which exist as a result of surface conditions and not as a result of a variation in the nature or concentration of significant impurities. The terms "chemical layer" and "chemical barrier" refer to the corresponding situation which does depend on a variation in significant impurities.

Both physical layers and chemical layers are suitable for the invention.

It is known how, by control of the distribution of impurities, to fabricate a block of silicon of which the main body is of one conductivity type while a thin surface layer, separated from the main body by a high resistance barrier, is of the other type. In this case the layer is believed to be chemical rather than physical. For methods of preparing such silicon, as well as for certain uses of the same, reference may be made to an application of J. H. Scaff and H. C. Theuerer, filed December 24, 1947, Serial No. 793,744 and issued September 18, 1951, as Patent 2,567,970 and to United States Patents 2,402,661 and 2,402,662 to R. S. Ohl. Such materials are suitable for use in connection with the present invention. It is preferred, however, to describe the invention in connection with the material which was employed when the discovery on which the invention is based was made, namely, N-type germanium which has been so treated as to enable it to withstand high voltage in the reverse direction when used as a point contact rectifier.

There are a number of methods by which the germanium and its surface may be prepared. One such method commences with the process which forms the subject-matter of an application of J. H. Scaff and H. C. Theuerer, filed December 29, 1945, Serial No. 638,351, and which is further described in "Crystal Rectifiers" by H. C. Torrey and C. A. Whitmer, Radiation Laboratory Series No. 15 (McGraw-Hill 1948). Briefly, germanium dioxide is placed in a porcelain dish and reduced to germanium in a furnace in an atmosphere of hydrogen. After a preliminary low heat, the temperature is raised to 1,000° C. at which the germanium is liquefied and substantially complete reduction takes place. The charge is then rapidly cooled to room temperature, whereupon it may be broken into pieces of convenient size for the next step. The charge is now placed in a graphite crucible and heated to liquefaction in an induction furnace in an atmosphere of helium and then slowly cooled from the bottom upwardly by raising the heating coil at the rate of about ⅛ inch per minute until the charge has fully solidified. It is then cooled to room temperature.

The ingot is next soaked at a low heat of about 500° C. for 24 hours in a neutral atmosphere, for example of helium after which it is allowed to cool to room temperature.

In the resulting heat-treated ingot, various parts or zones are of various characteristics. In particular, the central part of the ingot is of N-type material capable of withstanding a "back voltage," in the sense in which this term is employed in the rectifier art, of 100–200 volts. It is this material which it is preferred to employ in connection with the present invention.

This material is next cut into blocks of suitable size and shape for use in connection with the invention. A suitable shape is a disc shaped block of about ¼ inch diameter, and $\frac{1}{32}$ inch thickness. The block is then ground flat on both sides, first with 280 mesh abrasive dust, for example, Carborundum, and then with 600 mesh. It is then etched for one minute. The etching solution may consist of 10 c. c. of concentrated nitric acid, 5 c. c. of commercial standard (50 per cent) hydrofluoric acid, and 10 c. c. of water, in which a small amount, e. g. 0.2 gram, of copper nitrate has been dissolved. This etching treatment enables the block to withstand high (rectifier) back voltages.

Next, one side of the block is provided with a coating of metal, for example copper or gold, which constitutes a low resistance electric contact. This may be done by evaporation or electroplating in accordance with well-known techniques. As a precaution against contamination of the other (unplated) side of the block which may have occurred in the course of the plating process, the unplated side may be subjected to a repetition of the etching process.

The block may now be given an anodic oxidation treatment, which may be carried out in the following way. The block is placed, plated side down, on a metal bed-plate which is connected to the positive terminal of a source of voltage such as a battery, and that part of the upper (unplated) surface which is to be treated is covered with polymerized glycol boriborate, or other preferably viscous electrolyte in which germanium dioxide is insoluble. An electrode of inert metal, such as silver, is dipped into the liquid without touching the surface of the block, and is connected to a negative battery terminal of about −22.5 volts. Current of about 1 milliampere commences to flow for each square centimeter of block surface, falling to about 0.2 milliampere per $cm.^2$ in about 4 minutes. The electrode is then connected to the −45 volt battery terminal. The initial current is about 0.7 milliampere per $cm.^2$, falling to 0.2 milliampere per $cm.^2$ in about 6 minutes. The electrode is then connected to the −90 volt battery terminal. The initial current is now about 0.5 milliampere per $cm.^2$, falling to about 0.15 milliampere per $cm.^2$ in 10 to 20 minutes.

The battery is then disconnected, the block is removed and washed clean of the glycol borate with warm water, and dried with fine paper tissue. Finish drying has been successfully carried out by placing the block in a vacuum chamber and applying radiant heat. Either the heat or the vacuum may be sufficient, but both together are known to be. If spot electrodes are required on the upper surface as later described, they may be evaporated on in the course of the finish drying process. The germanium block is now ready for use.

The foregoing oxidation process, however, is not essential. Amplification has been obtained with specimens to which no surface treatment has been applied subsequent to the etch, other than the electrical forming process described below.

Fig. 1 shows a block 1 of germanium which has been prepared in the foregoing manner, and Fig. 1*a* shows the central part of the block 1 in section and to an enlarged scale. Referring to Figs. 1 and 1*a* together, the lower part of the block 1, whose surface is plated with a metal film 2 serving as the base electrode, is known to be of N-type. The thin layer 3 at the upper surface manifests P-type conductivity in which case, as is well known, the boundary 4 separating this P-type layer from the N-type material of the main body of the block behaves like a high resistance rectifying barrier. A first electrode 5, denoted the emitter, makes contact with the upper face of the block, i. e., with the P-type layer 3, preferably somewhere near its center, or at least several point diameters removed from the nearest edge. This contact is preferably of the rectifier type with respect to the body of the block 1. It may comprise a bent wire of springy material, from 0.5 to 5 mils in diameter, preferably pointed at the contact end electrolytically or by grinding. Processes for forming the points on such wires are described in United States Patent 2,430,028 to W. G. Pfann, J. H. Scaff and A. H. White. The point of the wire is brought into contact with the upper surface 3 of the block with a force of 1 to 10 grams, whereupon a cold flow of the metal of the point takes place, causing it to conform to any minute irregularities of the block surface. To this end the wire of the point should be ductile as compared with the material of the block. Tungsten, copper and Phosphor bronze are examples of suitable materials.

A second electrode 6, denoted the collector, makes contact with the upper face 3 of the block very close to the emitter 5. Best results have been obtained when the separation, measured along the surface of the block, between the collector and the emitter, is from 1 to 10 mils. This electrode 6 should make rectifier contact with the block and may be a pointed spring wire, formed and placed as above described in connection with the emitter 5. On the other hand, it may comprise a small spot of metal, for example, gold, which has been evaporated onto the upper surface of the block in the course of the final drying operation, and through which a central hole has been pierced (see Fig. 6) or across which a diametral slot has been cut (see Fig. 7). Evaporation of such a spot or film of metal onto the upper face after completion of the anodic oxidation process described above results in a non-ohmic rectifier junction or connection.

A third connection, termed the base electrode, is made, by soldering or otherwise, to the metal film 2 which has been plated onto the lower surface of the block 1.

While the unit is now ready for use, its operation can generally be improved by an electrical forming process, in which a potential in excess of the peak back voltage is applied to either one or both of the point electrodes 5, 6, i. e., between it and the base electrode 2. The unit is protected from injury by heavy currents by inclusion of a resistor in series. The effect of this treatment is believed to lie in a concentrated application of electric field and heat to the material in the immediate neighborhood of the point, and so in an improvement of the electrical characteristics of the contact.

Bias voltages are now applied to the electrodes, a small bias, usually positive, on the emitter of the order of a fraction of a volt and a larger negative bias on the collector, usually in the range from −5 to −50 volts, measured, in each case, from the body of the block, to the point electrode. These bias potentials may be obtained from batteries 7, 8 connected as shown or otherwise, as desired.

A load of 1,000 to 100,000 ohms may now be connected in circuit with the collector, for example by way of an output transformer 9, and a signal to be amplified may be applied between the emitter and the base electrode, for example by way of an input transformer 10. The connections may be those of the conventional triode as indicated in Fig. 10, or of the so-called grounded plate or cathode-follower, as in Fig. 11. In these figures the input signal is symbolically represented by a source 11 and the load by an output resistor $R_L$. Discovery of the amplifying properties of the device was made, however, with the grounded base circuit of Fig. 1, of which the vacuum tube counterpart is the so-called "grounded grid" connection of Fig. 2. (The principal distinguishing feature of this circuit as employed with a vacuum tube triode is that the load current flows through the source. This does not hold for the unit of the present invention, because the base electrode may draw substantial current.) The device as thus connected has given power gains of more than a factor of 75. Operating data on three different samples are given in the following table:

| Sample No. | 1 | 2 | 3 |
|---|---|---|---|
| Input Res. (ohms) | 640 | 500 | 1,000 |
| Output Res. (ohms) | $3\times10^4$ | $3\times10^4$ | $3\times10^4$ |
| Input Voltage A. C. R. M. S. | 0.29 | 0.30 | 0.10 |
| Output Voltage A. C. R. M. S. | 18 | 15 | 3.6 |
| Voltage Gain | 62 | 50 | 36 |
| Power in (watts) | $1.3\times10^{-4}$ | $1.8\times10^{-4}$ | $1.15\times10^{-5}$ |
| Power out (watts) | $100\times10^{-4}$ | $75\times10^{-4}$ | $42.5\times10^{-5}$ |
| Power Gain | 80 | 42 | 36 |
| Input Bias D. C. (volts) | +0.2 | +0.25 | +0.2 |
| Output Bias D. C. (volts) | −40 | −20 | −10 |

Confirmation of the presence of power amplification has been obtained by feeding back a part of the output voltage to the input circuit, as by way of the coupling between the windings of a transformer 12, as in Fig. 12 whereupon sustained self-oscillation took place.

It is to be noted that in the case of the No. 1 sample of the foregoing table, the power gain exceeds the voltage gain by a factor of $$\frac{80}{62}, \text{ or } 1.3$$

Inasmuch as, in any amplifying device which gives both power gain and voltage gain, the current gain is the quotient of the two, it is evident that sample No. 1 manifests a current gain of 1.3.

Without necessarily subscribing to any particular theory, the following hypothesis is presented to account for the experimentally determined facts, with all of which it is consistent. It is believed that the preparation of the semiconductor material and its surface treatment result in the formation of an oxide film, and, below it, of a layer or film 3 of P-type conductivity on the surface of the block, separated from the main body, which is of N-type, by a high resistance barrier 4. The oxide film is removed by washing. This P-type layer is very thin, perhaps $10^{-5}$ cm. in thickness, but the N-type body of the block provides all necessary support for it, and also provides a low impedance path to the base electrode 2. Its presence is confirmed by the fact that, particularly with featherweight forces on the contact points 5, 6 and with small voltages applies to them, P-type rectifier characteristics have sometimes been obtained. (P-type and N-type rectifier characteristics and their significance and differences are discussed in United States Patent 2,402,839 to R. S. Ohl.) But when the mechanical force on the contact point is increased to 10 grams or so and the voltage applied to it is raised to ½ volt or so, the rectifier characteristic is observed suddenly to shift from P-type to N-type.

Furthermore, potential probe measurements on the surface of the block, made with the collector disconnected, indicate that the major part of the emitter current travels on or close to the surface of the block, substantially laterally in all directions away from the emitter 5 before crossing the barrier 4. These measurements indicate the presence of a conducting layer at the surface of the block, which by inference is of P-type. In case the treatment stops with the etching process, the layer is believed to be physical. If it includes the further anodic oxidation step, the layer is believed to be chemical, but its nature has not been definitely established.

It is believed that the P-type layer on the germanium surface of the preferred embodiment is not greatly altered when a contact is made with a metal point. When a small positive bias is applied to the emitter, and a current flows, the carriers are largely those of the surface layer, that is, holes rather than conduction electrons. The potential probe measurements discussed above indicate that the concentration of holes, and thus the conductivity, in the vicinity of the emitter point, increase with increasing forward current. This hole current spreads out in all directions from the emitter 5 before crossing the high resistance barrier 4. With the collector circuit open, it then makes its way throughout the body of the block to the plated lower surface 2. (In the N-type body of the block, the current may take the form of a flow of electrons upward to neutralize the downward flow of holes from the P-type layer.) In the absence of the collector electrode 6, this current is the only current. Its path is indicated in Fig. 1*a* by stream lines 13.

Now when the collector 6 contact is made, and a negative bias potential is applied to it, of from $-5$ to $-50$ volts, a strong electrostatic field appears across the P-type layer 3, and across the high resistance barrier 4, being maintained by the fixed positive charges in the N-type body material in the immediate vicinity of the collector. The barrier and the P-type layer together are believed to be of the order of $10^{-4}$ cm. in thickness. Thus with 10 volts across a space of $10^{-4}$ cms., the average strength of this field is of the order of $10^5$ volts per cm., being greatest at the collector and extending in all directions from the collector, and is indicated in Fig. 1*a* by the broken line 14, within which some of the fixed positive charges are indicated by plus signs.

It is in order that the material shall be able to support a large voltage drop across this region that material of the so-called high back voltage type is preferred.

Now when the current of positive holes as indicated by stream lines 15 comes within the influence of this field, the holes are attracted to the region of lowest potential, namely, to the point at which the collector electrode 6 makes contact with the layer 3. There they are picked up by the collector 6 to appear as a current in an external load circuit 8, 9 connected to the collector 6. With the large negative bias on the collector 6, a variation of several volts on the collector makes very little difference in the strength or the extent of the field which surrounds it, and therefore has but a secondary effect on the fraction of the emitter current collected by the collector. In other words, the collector operates under conditions which are close to saturation, and the alternating current impedance of the collector circuit is high. As show in the table, it has been measured at values from 10,000 to 100,000 ohms. For maximum power output, the external load impedance should be matched to the internal impedance of the collector. On the other hand, variation of the voltage between the emitter 5 and the base electrode 2 by a small fraction of a volt, as by a signal which may be applied to the input terminals and so impressed on these electrodes, for example, by way of the transformer 10, effects a large variation in the emitter current and therefore in the collector current. Hence an amplified replica of the input signal voltage appears across the load resistor.

As shown in Fig. 1*a*, it is preferred that the area of contact of each of the two point electrodes with the surface of the block be large as compared with the layer thickness. This reduces the actual contact resistance as compared with the resistance encountered by the current flowing laterally in the surface layer itself; i. e., the spreading resistance of the layer.

When the collector electrode 6 is a single pointed wire or an evaporated metal spot, a fraction of the emitter current, after spreading out laterally in the P-type layer 3, eventually finds its way across the barrier 4 to the plated electrode 2 on the lower face of the block, i. e., to the base electrode. This situation is depicted in Fig. 3 which is a plan view of the block showing current stream lines 13 diverging in all directions from the emitter. The current stream lines 13 are straight in the absence of the collector field. When the collector field 14 is present the current field is distorted as in Fig. 3*a* which shows that even with a single collector electrode 6 more than half of the emitter current can be collected. In fact, the fraction of the emitter current which reaches the collector may in favorable cases be as high as 90 per cent.

Figure 7:
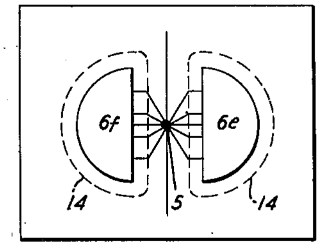

To increase this ratio especially in the case of units in which this ratio is less favorable, requires a modified electrode arrangment. Obviously, if the strong field 14 surrounding the collector 6 were to overlap or include the emitter 5, substantially all of the emitter current would be collected. This, however, would involve a loss of control. A solution is to provide two collectors 6, 6*a*, as in Fig. 4, or three 6, 6*a*, 6*b*, as in Fig. 5, symmetrically disposed about the emitter 5. Evidently with such an arrangement a considerably greater fraction of the emitter current is collected. In each case the boundaries of the collector field are indicated by broken lines 14. The several collectors may be connected together and as many may be employed as may seem desirable. Pursuing this solution still further leads to the ring collector 6*d* of Fig. 6, in which case the collector field 14 bears the shape of a semi-torus. Its trace on the plane of the block surface is shown by the broken lines 14*a*, 14*b*. The two semicircular spots 6*e*, 6*f*, of Fig. 7 are the substantial equivalent of the circle of Fig. 6.

Further increase may be made in the effective resistance of the barrier 4 and therefore in the internal resistance of the emitter-base electrode circuit and of the ratio of the collector current to the emitter current, by restricting the area of the barrier 4 itself to a comparatively small region surrounding the emitter 5 and the collector 6. This may be accompanied by restricting the area of the block 1 which is subjected to the anodic oxidation treatment or by machining the block after treatment. In the former case the result is a bowl-shaped P-layer 3′, bounded by a bowl-shaped barrier 4′, as shown in Fig. 11, and in the latter case it is a block 1' having the form of a truncated pyramid, with the barrier 4'' close to the smallest face, as indicated in Fig. 10.

In the event that the spring feature is not desired for the emitter and collector contact points, various alternative structures may be employed. For example, two sides of a wedge-shaped piece of insulating material 16 may be plated with metal films as in Fig. 8, one 51 to serve as emitter and the other 61 as collector. Or a cone-shaped piece 17 may be plated over its conical surface and a wire inserted through a central hole as in Fig. 9. The central wire 52 is preferably employed as the emitter and the surrounding plate film 62 as collector. The cone and the wedge serve to hold the interelectrode capacities to a minimum while keeping the contacts close together where they bear against the surface of the semiconductor.

Further understanding of the considerations which govern the thickness of the P-type surface layer may be had from the following considerations, which apply specifically to a chemical layer. Fig. 13 is a plot of the electrostatic potential within the body of an N-type semiconductor in contact with a metal. As above stated, the N-type material of the semiconductor contains fixed or bound positive charges. They are believed to be distribtued with fair uniformity in depth to a certain distance, beyond which the material is electrically neutral, because the bound positive charges are balanced by equal negative (electron) charges. In accordance with Poisson's equation:

$$\frac{d^2V}{dx^2}=-\frac{4\pi\rho}{\epsilon} \qquad (2)$$

where

V is the potential $x$ is the distance, measured from the metal into the semiconductor $\rho$ is the charge density, and $\epsilon$ is the dielectric constant of the material.

Assuming the charge density $\rho$ to be uniform, two integrations give the potential as a function of depth. When plotted, it is a parabola. In the figure, negative potential has been plotted upward. The vertical rise $E_e$ from the Fermi level to the terminus of the curve, i. e., to its intercept with the potential axis, represents the energy which must be imparted to an electron to cause it to move from the metal to the semiconductor. These matters are fully explained in the literature, for example, in "Schottky's theories of dry solid rectifiers," by J. Joffe, published in "Electrical Communication," vol. 22 (1944–1945) at page 217.

Similarly Fig. 14 shows the potential distribution, for positive holes, within a P-type semiconductor in contact with a metal. In this case the height $E_h$ of the terminus of the curve from the Fermi level represents the energy which must be given to a positive hole to cause it to leave the metal and enter the semiconductor.

Fig. 15 is a composite diagram showing, in the upper curves, the electron energy and in the lower curves the hole energy, within a semiconductor which comprises a thin layer of P-type material separated from a body of N-type material by a barrier. The fixed charges are negative in the P-type material and positive in the N-type, and for simplicity are assumed to be distributed uniformly in each zone. Integration of the charge density, twice, in accordance with Poisson's equation gives the lowermost curves, $a$, $b$ of the two groups, which represent equilibrium conditions and which, but for an additive constant $E_g$, are alike. The constant $E_g$ represents the energy difference between the filled band and the conduction band for the particular material.

The middle curves $a_1$, $b_1$, of each group represent the conditions when a small negative bias is applied to the semiconductor block 1 with respect to the emitter 5, and the upper curves $a_2$, $b_2$, of each group represent the conditions when a signal applied between the emitter and the control electrode further reduces the potential of the block. Evidently the alteration of the block potential with respect to the emitter operates in each case to increase the effective thickness of the P-type layer and so the density of holes and the layer conductivity. Such an increase in conductivity with increase in the forward bias has been observed in connection with the potential probe measurements referred to above.

The rounded peak of the hole potential curve lies below the Fermi level. The greater the thickness of the P-type layer, the more the terminus of this curve falls below the Fermi level, i. e., the greater the magnitude of $E_h$, and the greater the difficulty for holes to leave the metal of the emitter and enter the semiconductor. Similarly, the thinner the P-type layer, the less is the magnitude of $E_h$, and the greater the ease with which holes move from the metal of the emitter to the semiconductor and enter it. On the other hand, if the P-type layer is too thin, the conductivity of the layer, which is related to the width of the approximately flat portion of the upper part of the curve $b_1$ of Fig. 15 will be small. In the vicinity of the collector electrode, the thickness of the P-type layer should be sufficiently small so that the rectification characteristic of the collector is determined primarily by the body of the semiconductor and not by the layer. If, now, the collector is biased in the reverse direction relative to the body, most of the drop from the high voltage on the electrode occurs in the immediate vicinity of the collector, so that the impedance of the collector circuit is high.

The P-type layer is preferably adjusted to an optimum thickness lying between these extremes. Best results are believed to be obtained when its thickness is such that the terminus of the curve falls slightly below the rounded peak. Holes can enter the semiconductor without great difficulty and tend to collect in the region of greatest negative potential as a cloud of mobile positive charges. They then diffuse away from the emitter—laterally in Fig. 1, perpendicular to the paper in Fig. 15—some of them entering the field 14 of the collector 6.

Because the right-hand part of the lower curve falls well below the left-hand part, positive holes can cross the barrier only with difficulty. Because the P-type layer is thin, the energy $E_h$, required to cause holes to enter the layer, is small. Therefore holes enter easily under the influence of the positive bias on the emitter 5 and collect in the layer, like air bubbles as it were, at the top of a liquid in a closed vessel. They may easily travel in the layer and parallel with it.

The sense in which, and the reason why the barrier exists, separating a region of P-type conductivity from a region of N-type conductivity, despite the fact that the semiconductor material itself may be chemically and stoichiometrically uniform, may be explained as follows:

From elementary considerations, the conductivity is given by $$C=n_1e_1\mu_1+n_2e_2\mu_2 \quad (3)$$

where $n_1$, $e_1$, $\mu_1$ are the electron density, the electronic charge, and the electron's mobility, respectively, and $n_2$, $e_2$ $\mu_2$ are the corresponding quantities for positive holes.

It is known that $$n_1=A_1\epsilon^{-\frac{eV_e}{KT}} \quad (4a)$$

$$n_2=A_2\epsilon^{-\frac{eV_h}{KT}} \quad (4b)$$

where $V_e$ is the height of the electron space potential curve (*a* of Fig. 15) above the Fermi level, and $V_h$ is, correspondingly, the height of the Fermi level above the hole space potential curve (*b* of Fig. 15) and $A_1$, $A_2$, K, and T are constants for a given temperature. Inasmuch as the potential difference between the two kinds of space potential curves is a constant $E_g$, the conductivity may be written $$C=A_1\mu_1e_1\epsilon^{-\frac{eV_e}{KT}}+A_2\mu_2e_2\epsilon^{-\frac{e(E_g-V_e)}{KT}} \quad (5)$$

Since the factor $A_1\mu_1e_1$ does not differ greatly in magnitude from the factor $A_2\mu_2e_2$, it is a simple matter of calculation to show that this expression is a minimum when $$V_e=V_h=\frac{E_g}{2} \quad (6)$$

i. e., that the resistivity of the material is greatest at the depth at which the *a* curves and the *b* curves of Fig. 15 lie at equal distances above and below the Fermi level, respectively; and that furthermore, the resistivity departs rapidly from this maximum value as the space potentials $V_e$ and $V_h$ depart from equality. If $$V_e<\frac{E_g}{2}$$

the electron conductivity is greater than the hole conductivity, and the conductivity is N-type. If $$V_e>\frac{E_g}{2}, \text{ or } V_h<\frac{E_g}{2}$$

the hole conductivity is greater than the electron conductivity, and the conductivity is P-type.

Fig. 16 is a three dimensional representation of the conditions which the holes encounter in the course of their travel in the layer from the emitter to the collector—in the figure, parallel with the Y axis. As in Fig. 15, the X axis represents depth measured into the semiconductor and the V axis which is drawn to an approximately logarithmic scale, represents negative potential. As the holes approach the collector the peak of the potential curve becomes less and less pronounced until fianlly, at the collector, the region of lowest potential, to which the holes flow, is the collector itself, where they are withdrawn.

Of that part of the emitter current which crosses the barrier, a certain fraction crosses it again in the vicinity of the collector and is collected, thus forming a part of the collector current. The foregoing hypothesis as to the mechanism by which amplification is obtained applies to this fraction of the current as well as to the fraction which proceeds entirely within the layer.

The collector current contains still another component, which consists of a flow of electrons from the collector to the base electrode, crossing the barrier once on its way. A hypothesis as to the manner in which this current component takes part in the amplification process is as follows:

There is a potential hill at the contact point between the collector electrode and the surface layer which offers an impedance to the flow of electrons from the electrode into the semiconductor. In the absence of bias, the height of this hill, indicated by $E_e$ in Figs. 13 and 15, is the energy required to take an electron from the metal and place it in the conduction band of the semiconductor. When the collector is biased in the reverse direction, the effective height of the hill, and so the impedance of the contact point, are reduced by the electric field across the layer and barrier which acts in such a direction as to pull electrons from the electrode. The effect is to increase the flow of electrons into the semiconductor in a way which is similar to the enhancement of current from a thermionic cathode by field-induced emission. When the emitter is connected, and a current of holes flows to the collector, the accumulation of the positive charges of these holes in the vicinity of the collector tends to make the potential fall more rapidly with depth into the material, and so results in an increase in field and a decrease in the effective height of the hill, i. e., in the impedance of the contact point. Thus any increase in that component of the collector current which originates at the emitter is accompanied by a corresponding increase in the other component of the collector current, namely, in the flow of electrons to the base electrode. Hence the total change in collector current may be greater than the change in the emitter current.

From the foregoing description it will be clear that if it is desired to employ a semiconductor block of which the main body is of P-type so that the conductivity of the thin surface layer, whether due to impurities or to space charge effects, is of N-type, the polarities of all the bias sources of Figs. 1, 10, 11 and 12 are to be reversed. It is also to be understood that the magnitudes of the biases for best operation will depend on the semiconductor material employed and on its heat treatment and processing. Furthermore, it is possible to use a P-type layer of one semiconductor material on an N-type body of some other semiconductor material or vice versa. All such variations are contemplated as being within the spirit of the invention.

The invention is not to be construed as limited to the particular forms disclosed herein, since these are to be regarded as illustrative rather than restrictive.

What is claimed is:

1. A circuit element which comprises a body of semiconductive material, a first electrode making rectifier contact with said body, at least one other electrode making rectifier contact with said body and symmetrically disposed about said first electrode, and a base electrode providing a low resistance connection to said body to influence the magnitude of a current flowing between the first electrode and said at least one other electrode.

2. In combination with an element according to claim 1, means for biasing the first electrode for forward rectifier current flow, and means for biasing the other rectifier electrode or electrodes for reverse rectifier current flow.

3. A circuit element which comprises a body of semiconductive material, a first electrode making rectifier contact with said body, a plurality of other electrodes making rectifier contact with said body and symmetrically disposed about said first electrode, and a base electrode providing a low resistance connection to said body to influence the magnitude of a current flowing between the first electrode and any one of said plurality of other electrodes.

4. In combination with an element according to claim 3, means for biasing the first electrode for forward rectifier current flow, and means for biasing the other rectifier electrode or electrodes for reverse rectifier current flow.

5. A circuit element which comprises a block of semiconductor material of which the main body is of one conductivity type and a thin surface layer is of opposite conductivity type, a first electrode making contact with said layer over an area which is small as compared with the layer area, a plurality of second electrodes in contact with said layer and symmetrically disposed about said first electrode to collect current spreading in said layer outwardly in all directions from said first electrode, and a base electrode providing a low resistance connection to said body to influence the magnitude of said spreading current.

6. A circuit element which comprises a supporting body, a thin surface layer of semiconductor material supported by said body and differing in conductivity therefrom, a first electrode making contact with said layer over an area which is small as compared with the layer area, a second electrode making rectifier contact with said layer, substantially surrounding said first electrode and disposed to collect current spreading in said layer from said first electrode, and a base electrode providing a low resistance connection to said body to influence the magnitude of said spreading current.

7. A circuit element which comprises a supporting body, a thin surface layer of semiconductor material supported by said body and differing in conductivity therefrom, a first electrode making contact with said layer over an area which is small as compared with the layer area, a second electrode surrounding said first electrode and in contact with said layer, and a base electrode providing a low resistance connection to said body to influence the magnitude of current flowing in said layer between said first electrode and said second electrode.

8. A circuit element which comprises a supporting body, a thin surface layer of semiconductor material supported by said body and differing in conductivity therefrom, a first electrode making contact with said layer over an area which is small as compared with the layer area, a plurality of second electrodes symmetrically disposed about said first electrode and in contact with said layer, and a base electrode providing a low resistance connection to said body to influence the magnitude of current flowing in said layer between said first electrode and a second electrode.

9. A circuit element which comprises a supporting body, a thin surface layer of semiconductor material supported by said body and differing in conductivity therefrom, an emitter electrode making contact with said layer over an area which is small as compared with the layer area, at least one collector electrode symmetrically disposed about said emitter electrode and making rectifier contact with said layer, and a base electrode providing a low resistance connection to said body to influence the magnitude of current flowing in said layer between said emitter electrode and a collector electrode.

10. A circuit element comprising a body of semiconductor material, one portion of which is of one conductivity type and another portion of which is of different conductivity type, an emitter electrode engaging the first portion of the body, collector means engaging the body to collect current flowing to the body by way of said emitter electrode, said collector means being symmetrically disposed about said emitter electrode, and a base electrode providing a low resistance connection to said other portion of the body to vary the magnitude of said current.

11. A circuit element which comprises a body of semiconductor material, one portion of which is of one conductivity type and another portion of which is of different conductivity type, a first electrode engaging the first portion of the body, electrode means engaging the body and disposed symmetrically with respect to said first electrode, and a base electrode providing a low-resistance connection to said other portion of the body to vary the magnitude of a current flowing in said body between said first electrode and said electrode means.

JOHN BARDEEN.
WALTER H. BRATTAIN.

REFERENCES CITED

The following references are of record in the file of this patent:

UNITED STATES PATENTS

| Number | Name | Date |
|---|---|---|
| 2,476,323 | Rack | July 19, 1949 |
| 2,486,776 | Barney | Nov. 1, 1949 |
| 2,524,033 | Bardeen | Oct. 3, 1950 |
| 2,524,034 | Brattain et al. | Oct. 3, 1950 |